(12) United States Patent
Carlson, Jr. et al.

(10) Patent No.: US 10,410,693 B2
(45) Date of Patent: Sep. 10, 2019

(54) MULTIPROCESSOR SYSTEM WITH INDEPENDENT DIRECT ACCESS TO BULK SOLID STATE MEMORY RESOURCES

(71) Applicant: EMC Corporation, Hopkinton, MA (US)

(72) Inventors: Frederic Roy Carlson, Jr., Pacific Palisades, CA (US); Mark Himelstein, Emerald Hills, CA (US); Bruce Wilford, Los Altos, CA (US); Dan Arai, Sunnyvale, CA (US); David R. Emberson, Santa Cruz, CA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 75 days.

(21) Appl. No.: 15/342,940

(22) Filed: Nov. 3, 2016

(65) Prior Publication Data

US 2017/0076763 A1    Mar. 16, 2017

Related U.S. Application Data

(63) Continuation of application No. 14/249,289, filed on Apr. 9, 2014, now Pat. No. 9,519,615.
(Continued)

(51) Int. Cl.
| | |
|---|---|
| *G06F 15/167* | (2006.01) |
| *G11C 7/10* | (2006.01) |
| *G06F 12/08* | (2016.01) |
| *G06F 16/22* | (2019.01) |
| *G06F 15/173* | (2006.01) |
| *G06F 1/00* | (2006.01) |

(52) U.S. Cl.
CPC ............ *G11C 7/1072* (2013.01); *G06F 12/08* (2013.01); *G06F 15/167* (2013.01); *G06F 15/17318* (2013.01); *G06F 16/2246* (2019.01); *G06F 1/00* (2013.01)

(58) Field of Classification Search
CPC .. G06F 12/08; G06F 15/167; G06F 15/17318; G06F 17/30327; G11C 7/1072
See application file for complete search history.

(56) References Cited

U.S. PATENT DOCUMENTS

| | | |
|---|---|---|
| 4,402,045 A | 8/1983 | Krol |
| 5,870,412 A | 2/1999 | Schuster |

(Continued)

*Primary Examiner* — Reginald G Bragdon
*Assistant Examiner* — Edward Wang
(74) *Attorney, Agent, or Firm* — Womble Bond Dickinson (US) LLP

(57) ABSTRACT

A system includes a plurality of processors, each being coupled to each of remaining processors via a cluster of processor interconnects. The cluster of processor interconnects form a data distribution network. The system further includes a plurality of roots coupled to the processors, each root corresponding to one of the processors. Each root comprises a memory controller, one or more branches coupled to the memory controller, and a plurality of memory leaves coupled to the branches, each memory leaf having one or more solid state memory devices. Each of the branches is associated with one or more of the memory leaves and provides access to the associated memory leaves. Each of the processors can access any one of the memory leaves via a corresponding branch of any one of the roots over the data distribution network.

21 Claims, 15 Drawing Sheets

Related U.S. Application Data

(60) Provisional application No. 61/810,197, filed on Apr. 9, 2013.

(56) References Cited

U.S. PATENT DOCUMENTS

| | | |
|---|---|---|
| 8,874,850 B1 | 10/2014 | Goodson |
| 2008/0209116 A1 | 8/2008 | Caulkins |
| 2008/0282024 A1 | 11/2008 | Biswas et al. |
| 2009/0037658 A1* | 2/2009 | Sistla .................. G06F 12/0831 711/119 |
| 2009/0228762 A1 | 9/2009 | Krashige |
| 2013/0042119 A1 | 2/2013 | Bennett |
| 2013/0067138 A1 | 3/2013 | Schuette |
| 2015/0220433 A1 | 8/2015 | Schmidberger |

* cited by examiner $$P_i = \prod_{n=i}^{i+3} D_n \qquad D_i = P_i \otimes \prod_{n=i+1}^{i+3} D_n$$

$P_1 = D_1 \otimes D_2 \otimes D_3 \otimes D_4$
$P_2 = D_2 \otimes D_3 \otimes D_4 \otimes D_5$
$P_3 = D_3 \otimes D_4 \otimes D_5 \otimes D_6$
$P_4 = D_4 \otimes D_5 \otimes D_6 \otimes D_7$
$P_5 = D_5 \otimes D_6 \otimes D_7 \otimes D_8$
$P_6 = D_6 \otimes D_7 \otimes D_8 \otimes D_9$ $$D_5 = P_5 \otimes \prod_{n=6}^{8} D_n$$
$$D_5 = P_2 \otimes \prod_{n=2}^{4} D_n$$

MULTIPROCESSOR SYSTEM WITH INDEPENDENT DIRECT ACCESS TO BULK SOLID STATE MEMORY RESOURCES

CROSS-REFERENCE TO RELATED APPLICATION

This application is a continuation of U.S. application Ser. No. 14/249,289, filed Apr. 9, 2014, which claims priority to U.S. Provisional Patent Application Ser. No. 61/810,197, filed Apr. 9, 2013, the contents of which are incorporated herein by reference.

FIELD OF THE INVENTION

This invention relates generally to information processing. More particularly, this invention relates to a computing system with large and optimized flash memory resources.

BACKGROUND OF THE INVENTION

As larger and larger amounts of data become available for analysis, businesses and governments need to be able to exploit that data for faster, more accurate decision making and more efficient operation.

SUMMARY OF THE INVENTION

A system includes a collection of central processing units, where each central processing unit is connected to at least one other central processing unit and a root path into at least 10 Tera Bytes of solid state memory resources. Each central processing unit directly accesses solid state memory resources without swapping solid state memory contents into main memory.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

A computing appliance is a dedicated hardware device with integrated software designed to provide a specific computing function. A computing appliance does not differ in any fundamental way from a general-purpose computer, but typically is not configured to allow a customer to change the software or to reconfigure the hardware. The disclosed systems are capable of running a very broad range of applications and in this sense may be considered to be general-purpose computing machines. They implement a cost-effective architecture that efficiently creates a very large, shared memory.

The disclosed systems exploit low cost solid-state devices thereby providing "Flash As Memory™." This means that the solid-state devices (e.g., flash memory chips) have addresses in the processor's memory space. Thus, the processor can directly access data in "flash memory" without first having to swap it into its main memory. In certain embodiments, this memory space is on a very large scale, e.g., 10s of Terabytes to many Petabytes. Consequently, special designs and techniques are used, as described below. These special designs and techniques support parallel operations across the system.

The designs and techniques include a number of interconnected components composed of both hardware and software. Each component has unique characteristics and functions that are required for the operation of the complete system. When interconnected, these components create the desired computational capabilities.

Figure 1:
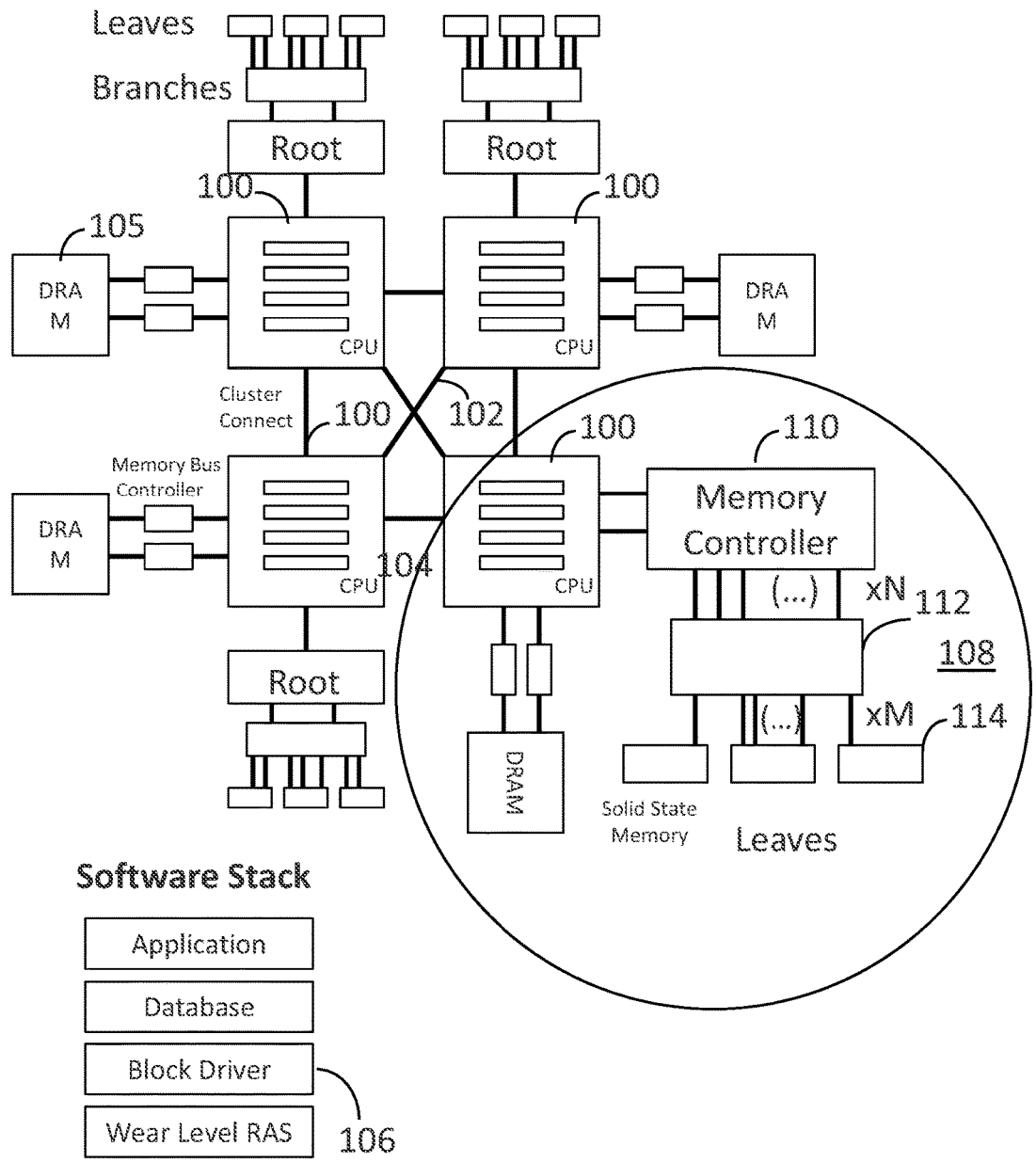
FIG. 1 illustrates a system configured in accordance with an embodiment of the invention.

A block diagram of an embodiment of the invention is presented in FIG. 1. It comprises several CPUs 100 each with many computing cores interconnected by a memory-speed interface 102, sometimes referred to as a cluster connect. Each CPU has a cache 104 and local memory 105, in this case DRAM, or another similar type of memory. Each CPU 100 also possesses local memory roots 108 operative as extended solid-state memory. The computing cores execute a software stack 106 resident either in local memory 105 or on the branches 112 connected through the memory controllers 110. In one embodiment, the software stack includes application programs, a database, block drivers, and wear level Reliability Availability Serviceability (RAS) modules, as discussed below. This block diagram pictures one of many possible configurations of the invention.

The number of simultaneous data accesses that can be serviced by a computer limits the performance of many data driven applications. Increasing the number of computing cores makes this problem worse. The disclosed system provides a large number of memory chips with a multi-rooted interconnection to the CPUs housing the computing cores. It provides efficient parallel application access to the data. Specialized system software manages the efficient scheduling of the computation and data access.

The disclosed system can be built in a variety of configurations that are suited to particular usage patterns. The invention may be optimized for a large number of specific uses such as these large memory consumption applications: Business Intelligence, Business Analytics, Geo-Seismic, Medical Imaging, Social Networking and Patient Management.

In one embodiment, a root memory controller 110 connects to a complex of interconnected CPUs 100, each consisting of multiple cores, and drives a hierarchy of branches 112 and leaves 114. Observe that each branch is attached either to another branch or a number of leaves or a mix of both. A leaf 114 is composed of flash memory or other solid-state or digital memory. In particular, there may be 1024 or more memory chips attached to a single root (e.g., FPGA(s) or ASIC(s)) through branches. Each CPU complex can be connected to eight or more roots. Consequently, if FIG. 1 were accurate and to scale, the number of solid-state memory leaves would overwhelm the figure. In this architecture the CPUs have thousands of memory targets that may be accessed in parallel. The number of CPUs in the CPU complex and the size and number of memory trees can also increase to very large numbers. The balance reflects the need(s) of a particular use (application). The components in this architecture are composed of both hardware and software. They may include the following:

1. Data Management System

A database or data management system that may be, and often is

1) Multithreaded;

2) Utilizes a single shared memory model, or a distributed memory model, or a combination of both, in order to achieve a high degree of parallelism. In some embodiments, this may be a cache coherent memory model in which each CPU thread caches its state in the memory.

2. Memory Management System

A Memory Management System that can be, and often is

1) Multithreaded to exploit large multi-cored systems;

2) Highly Parallel;

3) Very Large Capacity;

4) As a metaphor: moving down the memory management system results in growing parallelism. Effectively multiplying the concurrent operations at each level as the memory access moves from the root to the branch to the leaves.

3. Cache Management System

A Cache Management System that, in some embodiments, maintains data coherency across individual nodes (or cores) in the computer system.

4. Memory System

Each memory system consists of roots, branches and leaves, as mentioned above. In one embodiment, there are four roots sometimes referred to herein as Memory Modules (MMs). Conceptually, the roots replace four memory riser cards in the computer's chassis. They connect to the distribution network, providing an interface to a number of branches, each of which connects to a number of leaves.

Figure 2:
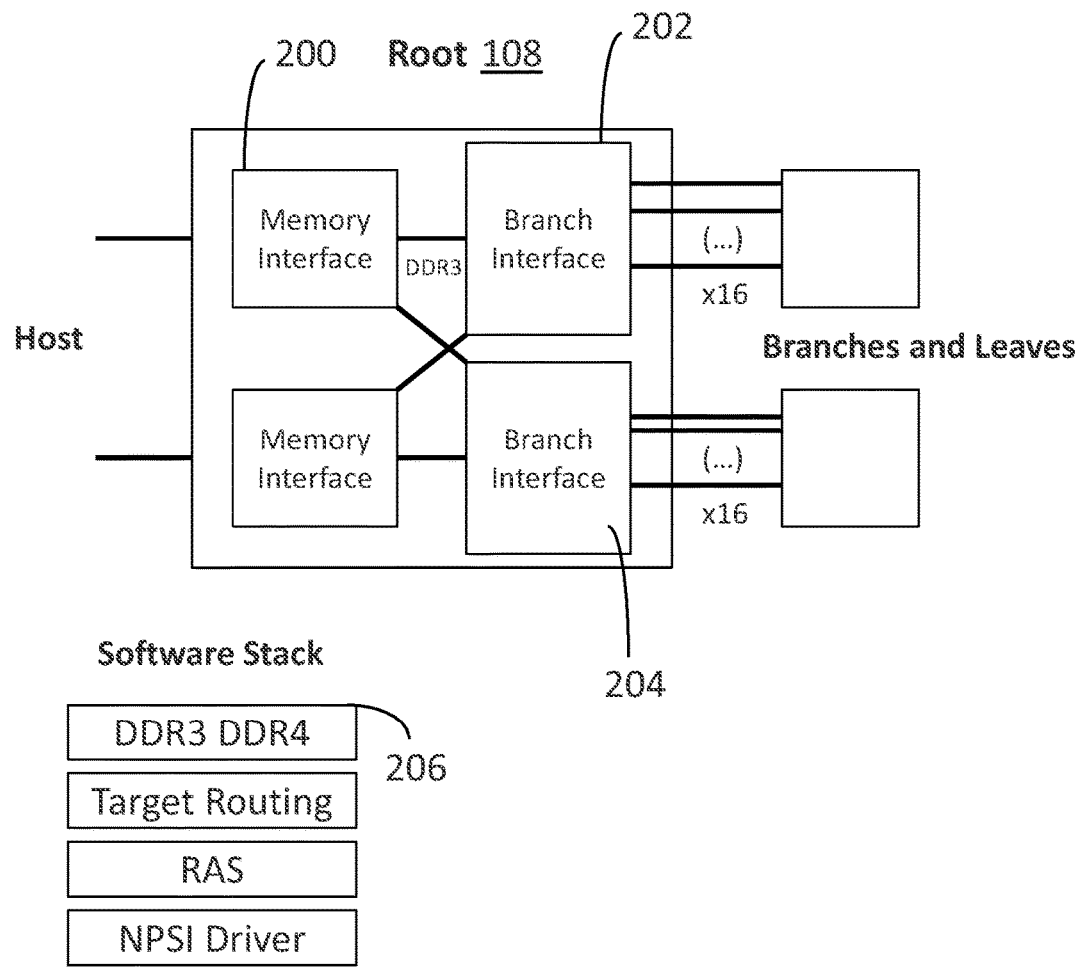
FIG. 2 illustrates a root module configured in accordance with an embodiment of the invention.
Figure 3:
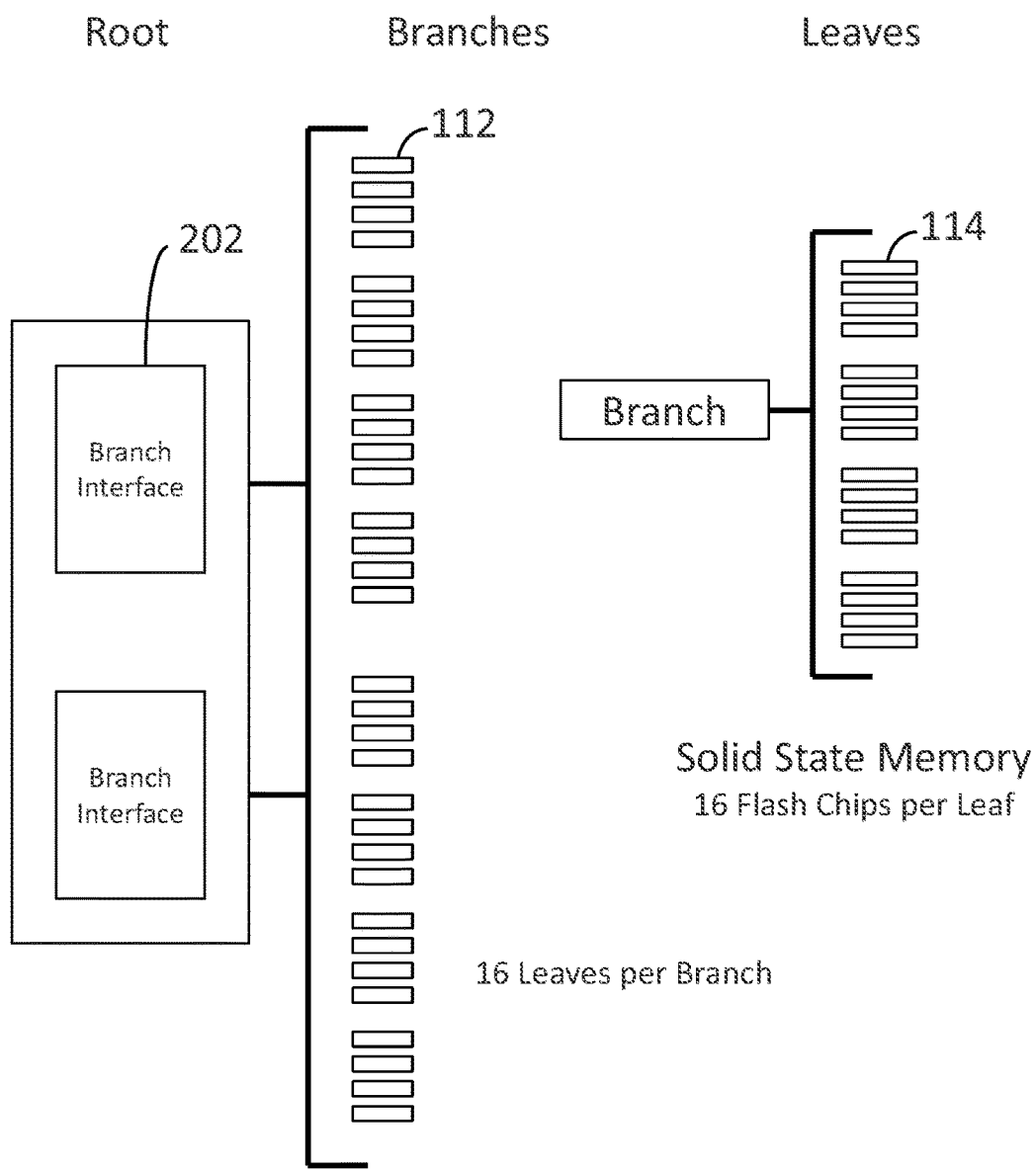
FIG. 3 illustrates a branch and tree architecture utilized in accordance with an embodiment of the invention.

FIG. 2 shows a single Root 108 comprising two memory interfaces 200, two branch interfaces 202, sixteen branches, and sixteen Leaves, containing at least one solid-state device per leaf. FIG. 3 is a more detailed depiction of a branch interface 202 and its connection to a set of branches 112 that have corresponding leaves 114. In one embodiment, each root has a total of 8 TB of Flash for a system total of 32 TB—half of which is available to user applications and half of which is allocated to redundancy and system use. In other embodiments, the allocation of memory resources to applications or redundancy may be different or may be controlled directly or indirectly by the application.

Each branch interface has internal memory 204 to execute a software stack 206. The software may contain a double data rate (DDR) controller, target routing software, a RAS module and a Non-blocking Parallel Solid State Interface (NBSI) driver. The branch interface may have computational resources in the form of FPGAs or ASICS.

The memory interface is connected to an inter-processor data distribution network in which all CPUs have access to all memory. We describe the memory as a multi-rooted tree composed of branches and leaves as described in detail below. We describe the computing complex as a shared-memory multiprocessor, which may be of a uniform or non-uniform type. The root may be one of many instances, which are locally or remotely connected. The interconnection technology may affect some of the functioning of the system, but it does not necessarily change the basic architecture or its operation.

In one embodiment, a Memory Master Controller (MMC) and a Memory Slave Controller (MSC) are implemented with dedicated hardware. A root is an MMC, while a branch is an MSC and a leaf is a solid-state memory device. For example, Altera Stratix V FPGAs may be used for both the MMC and MSC. In this case, each FPGA has 48 serial links operating at 12.8 Gb/s, and three links from each MMC go to each of sixteen MSC devices. Each MSC in turn connects to 16 leaves, each a solid-state memory device, for example a 32 GB Single Level Cell (SLC) NAND Flash device. Many other implementations, including implementations in which the components and their interconnections are changing in real-time, are possible.

Figure 4:
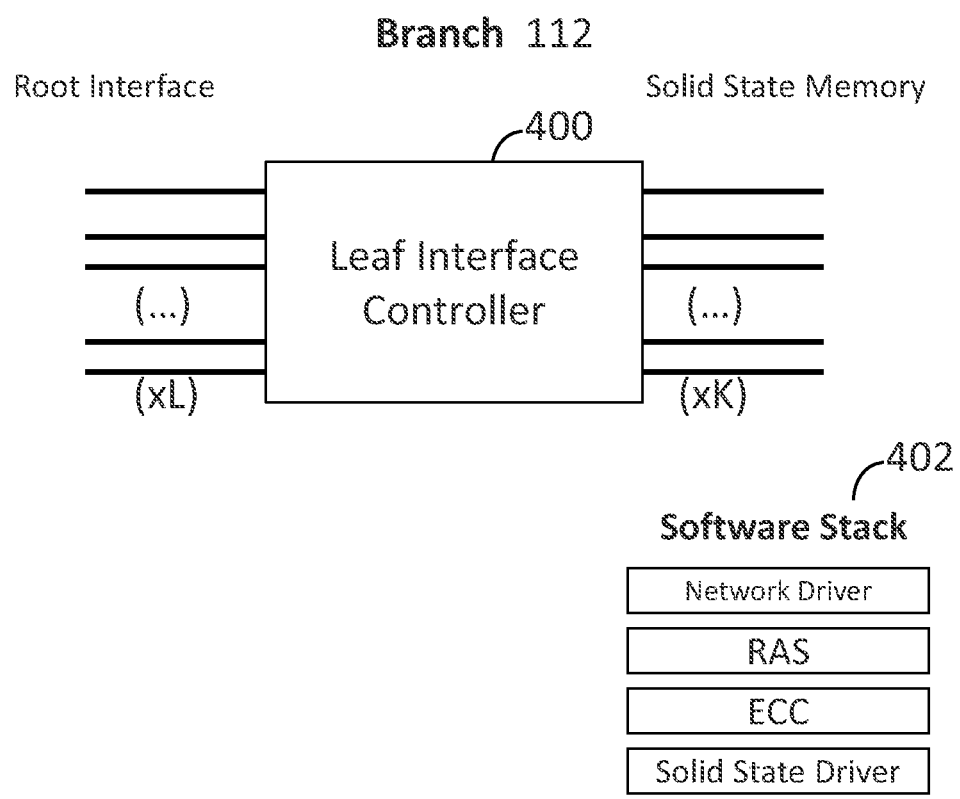
FIG. 4 illustrates a branch architecture utilized in accordance with an embodiment of the invention.

In one embodiment, a memory branch is a component with a number of leaves attached, where each leaf is a flash memory chip, as shown in FIG. 3. FIG. 4 illustrates a branch 112 with a leaf interface controller 400 that executes a software stack 402. The software stack 402 may include network drivers, RAS, error correction codes (ECC), database engines, data compression engines, encryption engines and solid-state drivers. These components provide a means of performing computational tasks on the data stored in the leaves without moving it to another processing unit. Observe that the stack is closer to the media because there are compute resources in the roots and branches.

In an alternative embodiment, a memory branch is a component with a number of branches and leaves attached where each branch executes the same or a different software stack. In heterogeneous systems, each branch may be aware of its neighbors and cooperate in the implementation of the network drivers, RAS, error correction codes, database engines, data compression engines and solid-state drivers.

In a further embodiment, as is the case with leaves, a branch contains a significant computing resource which implements rapid search or compression/decompression as data is read/written to the leaf. Local processors can encrypt, compress, scrub, validate, encode and decode data packets as well as route, validate, encode and decode header and command information present in the communication channels between the CPU, branch and root components.

Branches finally end in leaves. Each Leaf is a device that acts to read and write data pages into a non-volatile store. The leaf may be implemented in many forms. The Memory Management System controls the use of the leave's pages. Leaves may be implemented in various technologies but they have the property that a data page that has been written can also be read. Leaves do not need to be homogeneous or heterogeneous as to either device type or operating parameters.

In a further embodiment, a leaf contains a significant computing resource which implements rapid search or compression/decompression as data is read/written to the leaf. Local processors can encrypt, compress, scrub, validate, encode, and decode data packets as well as route, validate, encode and decode header and command information present in the communication channels between the CPU, branch and root components.

In some embodiments, one or more multi-layer architectures overlay the root-branch-leaf structure and includes varied techniques for encoding and decoding as described below.

In some embodiments, memory leaves have port access to mirrored memory spaces in a redundant system. In one embodiment, approximately half of the memory system stores data and another half of the memory space supports rapid data access. In another, a fraction of the physical memory is reserved in order to provide adequate performance. In a further embodiment, the memory distributes data across individual leaves using specially designed methods that minimize inefficiencies. In another embodiment, the memory components themselves may be composed of individual components that together produce the desired behavior. In a further embodiment, a segmented system has isolated domains that remain operative in the event of the failure of individual domains. In one embodiment, these components are interdependent. In order for the whole system to function efficiently, the interconnected components depend on each other for correct functioning and timely completion of each other's work.

This invention is a computing system composed of several inter-related parts that may have different implementations yielding mechanisms with different uses. The efficient interaction of these components creates system performance at an otherwise unattainable level. In the following exposition we enumerate several of the components and their functioning.

One embodiment of the invention provides performance improvements in wearing and writing to memory. Pooling of resources (computational, memory, connection bandwidth, etc.) creates the opportunity for optimization. When many servers attempt to serve many clients that attempt to access the same data, data consistency becomes an important requirement. The use of multi-level caching further complicates the architectures, which may be used to address these issues.

An embodiment of the invention is a mechanism to improve the performance of a group of devices by distributing work across all of them. Traditional Solid State Disks (SSDs) do "wear leveling" within the device and must do so whenever the device needs to erase a block. This is because they can only distribute writes within their device, even if a higher-level entity tries to distribute writes on other devices. The cost to execute the individual actions on a single device is much higher than the cost of execution when the writes are pooled. The disclosed system optimizes erases and writes across a large number of channels in order to enhance overall performance. It includes a "selection" mechanism and a real-time optimization mechanism that disperse the work wisely without substantially increasing the latency of the operations as viewed by the client.

For example, this technique is used in the architectures of FIG. 1 and/or FIG. 2. An example transaction is the distribution of data pages using a log structure to increase the efficiency of reclaiming erased blocks (e.g., "garbage collection"). Pages of memory are mapped into a core's virtual memory address space. The pages are written in a sequential manner to consecutive solid-state memory addresses. These write operations may be grouped together in order to more efficiently utilize the memory device's bandwidth. For example, four pages may be written simultaneously onto the four planes of a particular flash device. This method fills one block of the flash device before moving on to the next. Consequently, for many applications that perform delete operations in a similar order before again performing write operations; many deleted pages can be reclaimed from the same block simultaneously. In other circumstances, the write operations may be assigned to different blocks in order to maximize the number of pages that may be reclaimed.

Another aspect of the invention is a mechanism to efficiently move blocks between memory components in a memory hierarchy. In the above examples, we have a hierarchy of processors (CPUs, roots, branches) involved in accessing data from solid-state devices. Any time data is moved from one level of the hierarchy to another, there may be a performance penalty. Conversely, if an operation is performed without crossing levels a performance improvement is commonly realized.

One example of an opportunity to realize performance gains occurs during erase operations for solid-state media. In preparation for erasure, one must move all pages containing data that is still in use ("live"). The CPUs do not need to examine this data during this time; therefore we realize a performance gain by not crossing hierarchy levels to the CPU with this data. Some embodiments can move this data from branch to branch and some from root to root. In the case of movement between roots we move a copy to the CPU and back to the original root or another root. These copies require memory space in the CPU, which in turn impacts the memory available for root buffer management, cache utilization on the CPU, and CPU buffers. Data movement from within a root or from root to root can be accomplished using a load/store model in the CPU or using a direct memory access (DMA) model in the roots. The decision to use one path or the other can be made in the operating system layer or potentially in the roots themselves, or even using a distributed mechanism combining the two.

Another embodiment of the invention is directed toward a mechanism to distribute reads to maximize performance. As devices with disparate latency, throughput, and access methods evolve for data, CPUs cannot access data and expect the uniform performance they have come to expect in DRAM. This mechanism parallelizes reads in order to achieve very high throughput from non-DRAM devices. These performance levels are an order of magnitude closer to DRAM speeds than other approaches.

In one embodiment, we examine a system containing solid state Memory Modules with 8 TB of data that have long latencies and complex access mechanisms. In particular the solid state media on a root (Memory Module) allows 2048 simultaneous 4096 byte reads compared to a single 64 byte read using DRAM modules with 256 GB of data. In this embodiment, each 4096 page on the system takes 100 µseconds and each 4096 byte read on DRAM takes 1 µsecond. In this embodiment, there is an additional 5 µseconds per page for the system after the simultaneous read.

While using DRAM is 100 times faster reading a single page, when reading 2048 pages, DRAM is only 5 times faster than the disclosed system. Larger embodiments, composed using more memory chips, narrow this difference considerably.

Our invention includes the software, firmware, and hardware design to enable the parallelism described above. This invention embodies a mechanism where the read requests and/or data are already being distributed so that subsequent reads can take advantage of the parallelism in the memory system. The basic technique is implemented by placing data pages that are likely to be read simultaneously on different (independent) devices (channels). In one embodiment, each page is written onto a device on a different channel (or branch) relative to a previously written page.

Another aspect of the invention is a mechanism for distributing writes to maximize performance, while making efficient use of buffers and channel bandwidth. It was previously noted that read requests and/or data must already be distributed so that subsequent reads can take advantage parallelism. This embodiment of the invention distributes data writes to facilitate parallelism in subsequent reads.

In one embodiment, the Linux Operating System is used. Like most modern Operating Systems, Linux uses a Memory Management System that buffers data in DRAM to/from a data device like a spinning disk or solid state media. Applications may write data by using Linux's DRAM directly, using Linux's DRAM as a staging area, or by providing Linux with a reference to the Application's DRAM. In all these cases, writes are distributed over time and space.

The disclosed system has a huge number of independently operational units. We distribute page writes across those units. This is a temporal distribution because we write pages in different units based on when they are ready to write.

This distribution helps performance in two ways. First, just like reads, the system can do simultaneous writes to independent units (leaves), enabling parallelism. Second, subsequent reads will also be distributed and therefore capable of taking advantage of the parallelism. Because there are so many leaves, it is unlikely that reads conflict with each other, given the temporal distribution and large number of units.

Another aspect of the invention is a mechanism implementing wear groups across channels or logical units. The disclosed technique is method to efficiently reuse "erasure blocks" of memory and to divide the usage evenly across pages. The technique may be performed in the software stack 206, or at a root 108 (e.g., RAS of FIG. 2), or by both cooperating to optimally perform the technique.

The block erasure mechanism works very similarly to memory space reclamation (e.g., garbage collection). However, the mechanism handles three added complications that a normal garbage collection technique does not. First, pages must be erased in large contiguous chunks before they can be written again. Second, pages eventually wear out, so one must implement wear levelling. Third, it is desirable to spread traffic across as many channels as possible in order to get the best read and write performance By implementing an enhanced generational garbage collector, one can achieve good performance (addressing points 1 and 3), while still providing good wear levelling (addressing point 2).

In a generational garbage collector, all new objects are placed in a young generation pool. After garbage collection is performed on the young generation pool, objects that survive collection are placed in an older generation pool. Objects that survive collection a second time are placed in an even older pool, and so on. A simple implementation of this using flash as the storage medium would lead to extremely bad wear levelling. Blocks used for the young storage generation would be erased far more frequently than blocks for older generations. We avoid this problem by periodically changing which generation the physical flash blocks belong to. By moving pages with high erasure counts into older generations, we reduce the number of erasures those pages will see in the future. The blocks for the different generations are balanced between the different flash channels. This ensures that one can spread read and write traffic across many different channels.

Another embodiment of the invention relates to accumulated redundant data protection stripes. This embodiment of the invention accumulates Data Protection Stripes using simple (e.g., XOR) debit/credit computations onto fault-independent memory devices. The technique includes a method for fast reconstruction of damaged data blocks. This mechanism may be embodied in the CPUs, the roots, or the branches of the system. Depending on the particular embodiment, it will interact with the RAS embodiments in different ways.

Erasure codes applied to devices with large asymmetric read-write times need a way of bounding overhead and providing large decreases in undetected errors. In addition, low computational overhead and bounded space are highly desirable. We present a mechanism for erasure coding data that achieves low, fixed overhead in space and time with adjustable error detection and correction levels.

Figure 5:
FIG. 5 illustrates a stream encoding and decoding technique utilized in accordance with an embodiment of the invention.

The following data protection scheme is built on top of the disclosed write mechanism. FIG. 5 illustrates a stream of 17 data blocks. In this example, parity values are computed for four data blocks at a time, but the technique could be used on any number of data blocks. The parity values utilize a sliding window of data blocks. To improve efficiency, a prior computed parity value (e.g., P1) is subject to an exclusive-OR (XOR) operation, with the result combined with a new data block (e.g., D5). This approach can be cascaded for all new arriving data. FIG. 5 provides the mathematical basis establishing the efficacy of the approach. This approach combines low fixed computational overhead with fixed space requirements. In effect, this mechanism utilizes a "moving window" which contains data blocks that are XOR'd together to form a parity block. As the window moves, new blocks are XOR'd to the parity block and old blocks previously XOR'd to the parity block are again XOR'd to the parity block. This effectively adds a new block and removes an old block, thus "moving the window."

Another embodiment of the invention is directed toward reconstructing data from parity when a direct read is waiting for a previously requested erase, or other operation that is slower than a read, to complete and release the channel. This functionality may be implemented in software in the software stack running on the CPU in FIG. 1. In particular, in this embodiment the functionality is implemented at the bottom of the software stack. In general, the functionality is directed towards a method for minimizing the latency of read operations by reconstructing the accessed data from redundant data stored on a different device when the primary device is busy.

Memory pages are assigned different channels (e.g., a link from the CPU, through a root, to a leaf). Each leaf stores many data pages. Only a single data page may be read from or written to a leaf at a time. Pages within leaves are sometimes erased. It takes much longer to perform erasures or other slow operations than it takes to do a read or a write and many reads and writes take place simultaneously across the leaves. Consequently, it is desirable to avoid reading from a leaf where an erase operation is in progress.

Therefore, in addition to data pages, we also store data protection pages. That is, for a given data page A, we store a set of data protection pages for A that are stored on different leaves. In the event that data page A is lost, the contents of data page A can be reconstructed by reading some of the data protection pages for A and some other data pages (not including A). The important thing to note is that the contents of data page A can be reconstructed without having to access the leaf that A resides in.

The usual application for this technique is to reconstruct the contents of A if the page (or even the whole leaf or branch) containing A is lost. However, we can also use this mechanism to improve performance, as follows: If the leaf containing A is busy, and will be busy for a long time, instead of reading A directly, we can reconstruct A from the necessary data protection information. In the case of an erase, very often this will allow satisfying the request for A faster than waiting for the erase to complete. This technique can be combined with the moving window technique to quickly reconstruct the data.

Another approach to implementing this technique is to utilize a RAID 5 like (or other RAID) erasure code. This means computing the exclusive-OR of a number of data pages to produce a parity page or computing a more complex code, for example a low density parity check code or a so called Raptor code, which allows recovery of the needed data.

Another embodiment of the invention is directed toward a mechanism for efficient read buffer utilization in a hierarchical memory. The problem is to improve system performance through more efficient buffer utilization. Rather than allocate buffers when the software issues the read command, allocate the buffer just before the data becomes available (lazy allocation). This allows software reads to statistically-multiplex over a smaller number of buffers. In a system where the number of buffers is limited, this leads to better overall system performance.

When a CPU, reads data from a slower resource into a faster resource, such as reading from a flash memory into high-speed memory, the CPU allocates a buffer in the faster resource and waits for the slower device to fill the specified buffer. The buffer may be treated by the operating system as "busy" from the start of the operation until the data is finally returned. With this idea, the system issues a read, but does not pre-allocate a buffer for the data. The slower system (being read from) will allocate the buffer just before the data is transferred to the CPU and then fill the buffer with data. This allows buffers to be "busy" for a shorter period of time. This mechanism improves the utilization of the buffers in the faster resource, which in turn leads to increased system performance and reduces the number of buffers required for a particular performance level.

Another embodiment of the invention is directed toward a data protection scheme to optimize performance while minimizing leaf resources. Data Protection (DP) parity generation is generally simple and very fast. Large numbers of bit errors take a long time to correct. In practice, most errors encountered have a small number of bits in error.

One embodiment of the invention generates a large number of parity bits and has a two-tier correction algorithm. A small number of bits in error can be corrected in hardware in either the branch or leaf, keeping the hardware implementation small. If a large number of bit errors occur, they can be corrected in software or firmware, by using all (or more) of the larger number of parity bits stored with the data.

This hierarchical mechanism improves space and computational efficiency. This mechanism splits the Data Protection into two parts: one smaller part, with limited correction capabilities and a slower but more capable part with the correction capability in the software (or some other "higher level" of processing). For 99.999% of all required corrections, the correction logic inside the leaf will suffice. However, when the leaf is unable to correct the data, the software will use its additional capability to correct the data. This trades a small, frequently used leaf correction block plus a very infrequently used software correction block against a single, larger leaf block with extensive capabilities that are not very frequently used. Making this tradeoff leads to a much smaller, better-utilized leaf block and improves the space efficiency of the leaf. The mechanism can be cascaded into several levels, each of which improves upon the data correction capability of the previous level. Finally, other system level data protection can be applied to recover lost data from redundant copies on other leaves. Block based codes (e.g., BCH or Reed-Solomon) can perform this function. In addition, specially designed Low Density Parity Check (LDPC) codes may be used. This "soft error" technique allows for re-reading the data from the device and combining several read attempts to produce better error rates and can also be combined with the above technique for separating the error detection and correction from the rare cases requiring more complex logic.

The following discussion is directed toward various specific embodiments of components of the invention. As previously discussed, the system components include a multi-processor/multicore complex connected with a point-to-point distribution system and a multi-rooted, redundant parallel accessible (branched) memory. The system may be configured with commercially available components, such as shown in FIG. 6.

A multi-core, multi-processor, server class, hardware platform is used to implement an embodiment of the invention. In one instance, an IBM 3850/3950 X5 system (based on the Intel Boxboro-EX platform) serves as the host. The working model contains 4 DRAM memory boards and 4 memory modules (roots) with 64 terabytes of flash memory. A fraction of the flash memory is available to user applications. The fraction may vary depending on the usage history and current, measured performance levels. This system is representative of many multiple processor systems connected in a Non-Uniform Memory Architecture (NUMA) configuration with high-speed point-to-point, cache-coherent memory interconnects.

The hardware components may include:
The System Baseboard (Motherboard)
Scalable Memory Interface (SMI) Boards (Roots)
Flash Module Baseboards (Branches)
Memory Module Daughter Cards (Leaves))
Supporting mechanical, thermal and power systems.

Figure 6:
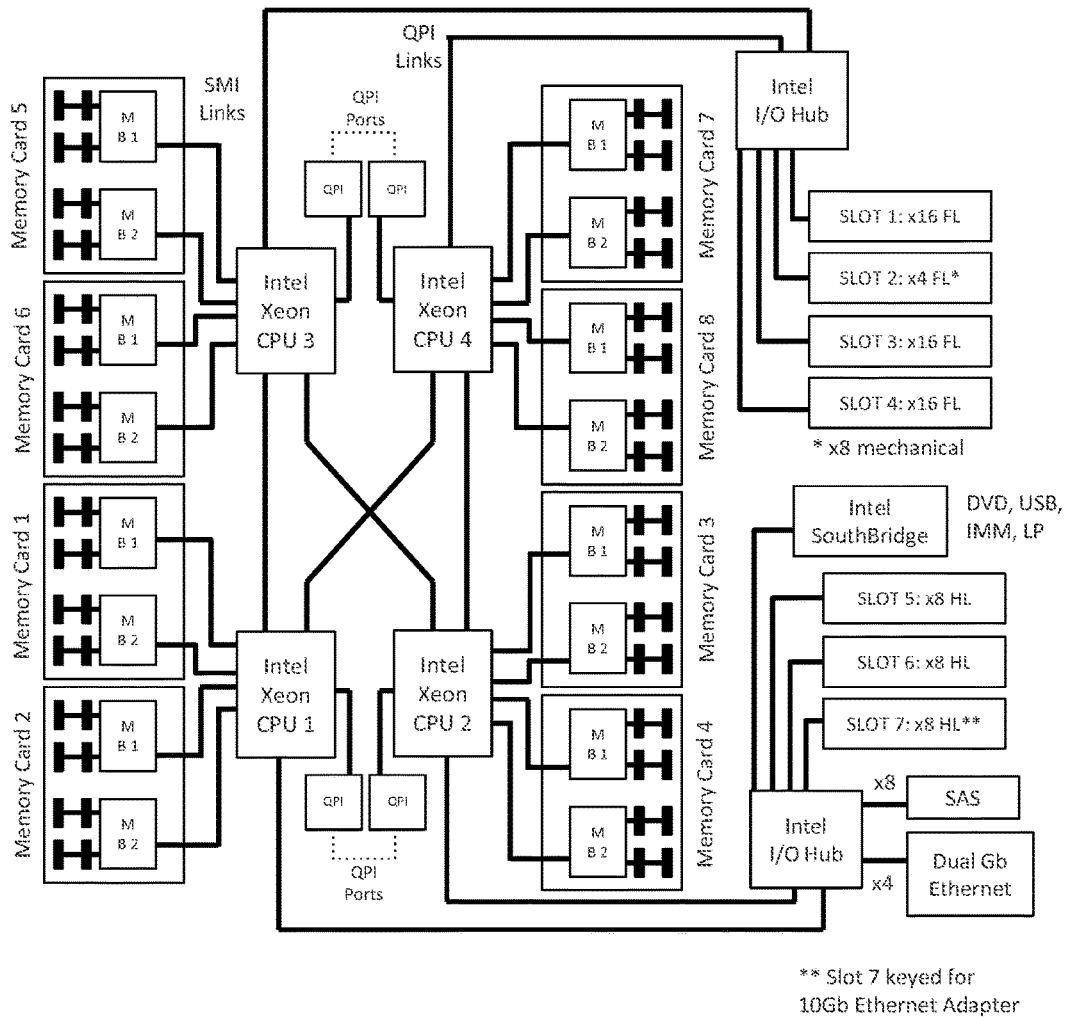
FIG. 6 illustrates off-the-shelf components that may be utilized in accordance with an embodiment of the invention.

FIG. 6 shows a multicore, server class platform that may be used to implement the invention. In particular, the figure is a block diagram of the IBM X5 3850 chassis. Based on the Intel's Boxboro-EX platform, it includes four Xeon 8870 (Westmere) CPUs interconnected via QuickPath Interconnect (QPI) links. Each Xeon chip has two memory controllers. Each memory controller runs two Intel SMI (Scalable Memory Interconnect) links in lock step in order to implement a 128-bit wide data path to memory (144 bits with check bits). Each SMI link communicates with an Intel 7510 Scalable Memory Buffer chip, which, in turn, converts SMI requests to double data rate type three (DDR3) synchronous DRAM transactions. There are two DDR3 links on each 7510. The Xeon processors perform 128-bit operations and do not use the data mask bits on the DDR3 links.

The memory controller and Cross bar is a distributed memory structure designed to transport data pages between the Serial Link interfaces and the Flash Controllers inside the MSCs. The memory controller is a branch in the system. A flash page is a property of the particular chip utilized, but in general it is a 4 KB memory block. An erase block is a multiple of the flash page size (e.g., 256 KB or 512 KB).

The Memory Controller is used to buffer flash pages and control messages between the Interlaken interface and the Flash Controllers. Interlaken is an interconnect protocol for bonding wires (individual data connections). That is, it is a single logical connection with multiple channels. The MSC has bonded data transport channels (e.g. 2 Interlaken interfaces), one per MMC. The software may schedule pages evenly between both MMCs into a branch. In one embodiment, there are 32 branches per MSC. As there are inbound and outbound pages on each MMC, the data path can be split into 4 main parts.

Figure 7:
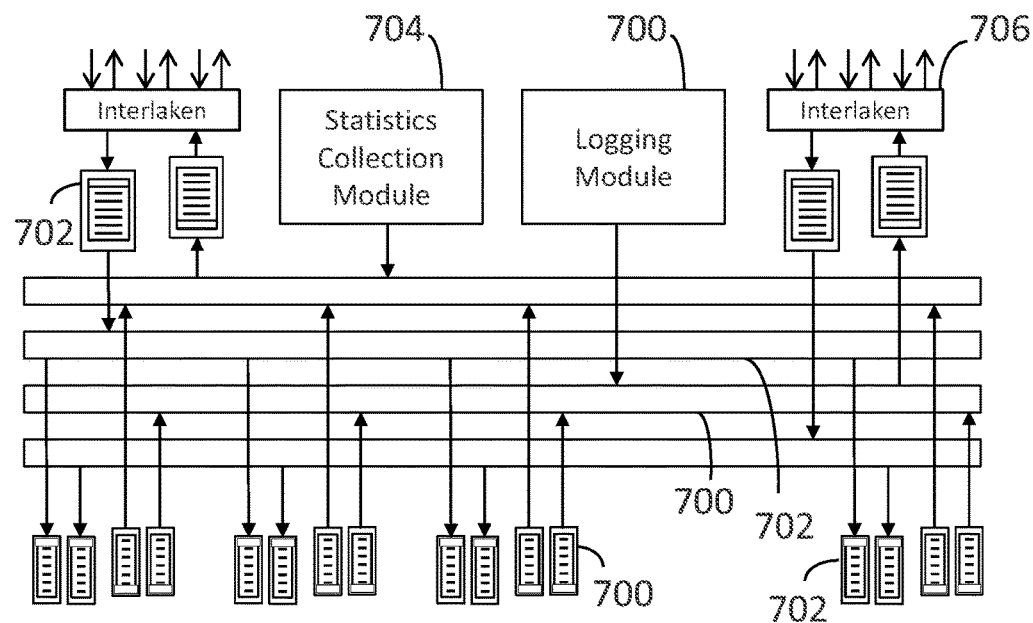
FIG. 7 illustrate a memory controller utilized in accordance with an embodiment of the invention.

Traffic from 32 branches multiplexed up to MMC0
Traffic from 32 branches multiplexed up to MMC1
Traffic from MMC0 de-multiplexed out to the branches
Traffic from MMC1 de-multiplexed out to the branches This is shown in FIG. 7. Items 700 represent one data path; items 702 represent another data path and so on. Also shown in the diagram is the Statistics block 704, which sends STATS (statistics) message to MMC0 only.

Figure 8:
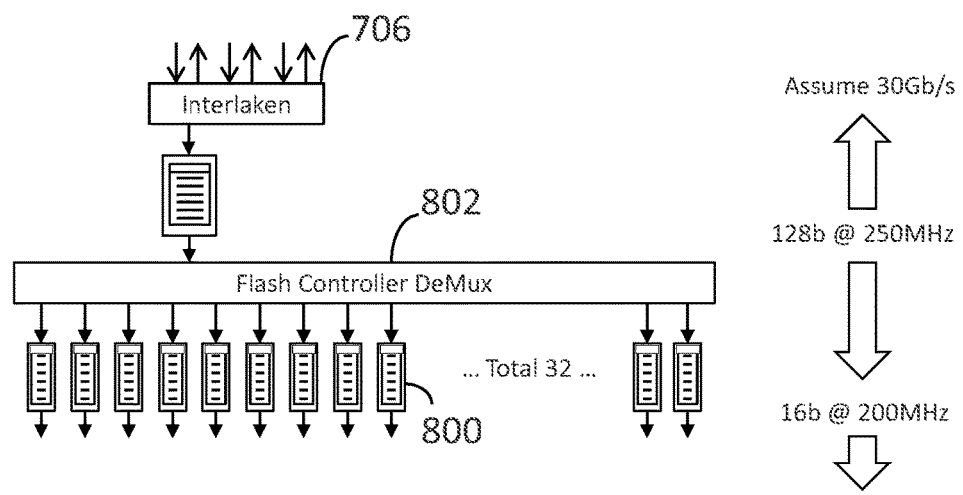
FIG. 8 illustrates a flash interface the may be utilized in accordance with an embodiment of the invention.

This distributed memory design lends itself well to the Altera chip architecture, which spreads its m20k memories throughout the device. The 128-bit data path from the branch will be carried through the Interlaken FIFOs 706 and into the "top" interface of the branch FIFOs. There is a clock domain change between the Interlaken interface and the branch. This is done at the "bottom" interface of the branch FIFOs. Exemplary interfaces are shown in FIG. 8.

This whole Memory Controller is built as a set of distributed FIFOs 800. This embodiment has simple FIFOs, but priority could be given to messages that consist of just a header. In the "southbound" direction from the Interlaken 706 to the Flash Controllers 802, this allows read requests to "overtake" write pages. In the northbound direction it allows write completions to overtake read pages. Only the FIFOs going into the Flash Controllers will need to be changed to Priority FIFOs.

Priority FIFOs allow headers and pages to be ready for transmission to the Interlaken interface 706 at the same time. If the Interlaken interface 706 is a flow controller for Pages, but not for headers, then the headers may flow around the read pages, allowing writes to complete while nothing else can continue. This situation would make memory coherence difficult or impossible to maintain.

To insure the consistency of the memory contents a priority-based mechanism may be used. The priority FIFO, shown in FIG. 9, consists of two FIFOs, a large one built from memory 900 and a small one built from logic 902. A de-mux block 904 at the input will check message types and forward the message to the appropriate (short or long) FIFO. On the output side of the FIFOs, a scheduler 906 employing a simple priority scheme selects which FIFO sends its message (with attached page) next.

In one embodiment, the data-path interfaces are the usual 4-wire (START, END, VALID, READY) type interface with 128 data-bits. This interface will be used to interface into the Interlaken block as well as both sides of the FIFOs. This can be used to flow control the traffic into the multiplexors as well. This interface may be used for all the blocks in the Memory Controller.

Figure 9:
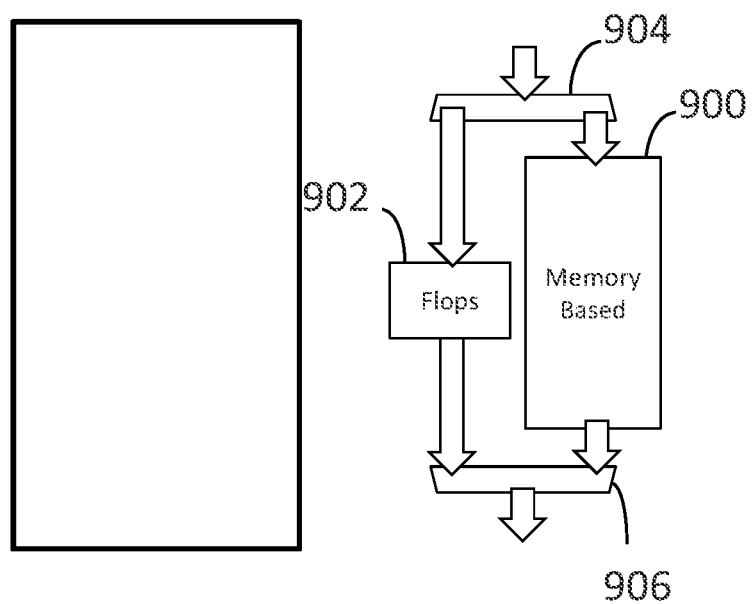
FIG. 9 illustrates a priority FIFO scheme utilized in accordance with an embodiment of the invention.

The two FIFO types of FIG. 9 can use the 4-wire (START, END, VALID, READY) interface although two Ready signals could be used to select which queue to hold from a root, such as shown in FIG. 2.

Figure 10:
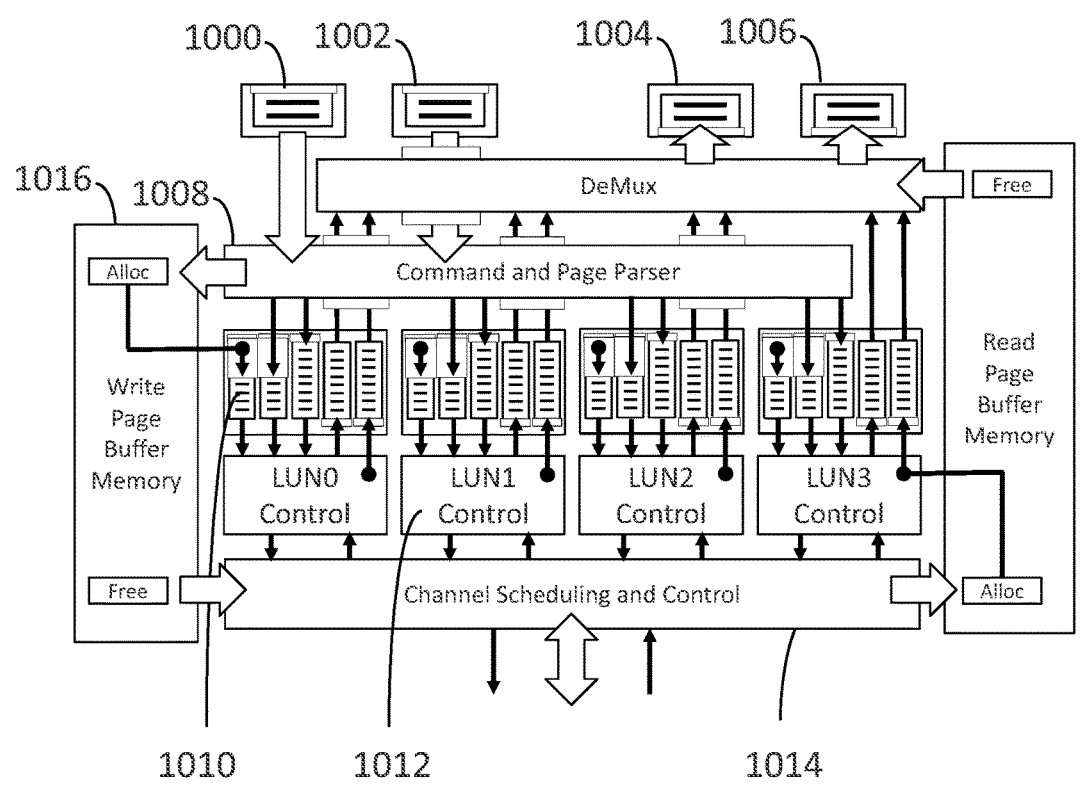
FIG. 10 illustrates a memory architecture that may be utilized in accordance with an embodiment of the invention.

A Flash Controller connects to the bottom of the memory controller and controls one flash channel and controls the operations of the flash device. FIG. 10 illustrates an exemplary memory and flash controller architecture. In one embodiment, each MSC has 32 Flash Controllers. Each Flash Controller communicates with one 8-bit flash channel. Each flash device has two channels, with 4 Logical Units (LUNs) per channel. So each flash controller controls the 4 LUNs on the channel it communicates with.

The Leaf Memory Controller connects to the Memory Controller FIFOs 1000, 1002, 1004 and 1006. In this working model the leaves are constructed from "Flash" memory chips. Write pages are stored in the Write Page Buffer Memory when they get to the Flash Controller and are read by the Channel Scheduling and Control block when the data is needed to send to the flash channel Read pages coming from the flash are stored in the Read Page Buffer Memory and are then sent up towards MMC0 or MMC1 as appropriate.

In one embodiment, the Flash Controller is split into 5 main sections: Command and Page Parser 1008, LUN Controller FIFO 1010, LUN Controller 1012, Channel Scheduling and Control 1014 and Data Protection. Commands to the Flash Controller may be parsed in a number of places in this design. These may include: The Credit Based Flow Control, the Command Parser, the LUN Controller, the channel scheduler and the De-Mux block at the top of the Flash Controller. The Credit Based Flow Control block may receive CREDIT commands from the MMC. These commands are used as a no operation (NOP) command just to carry buffer fullness information from the MMC to the MSC. The Credit Controller removes these commands from the data stream. That block is shown in the main MSC block diagram on the MSC Design page. All other blocks that parse commands are shown in the Flash Controller block diagram shown in FIG. 10.

Figure 11:
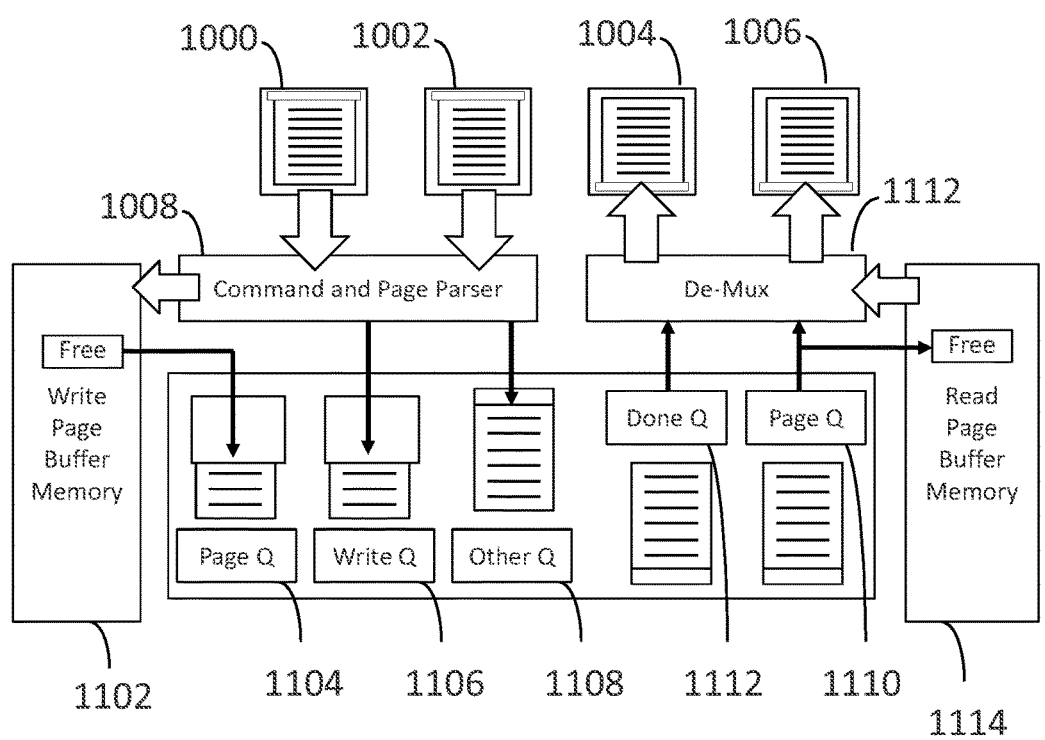
FIG. 11 illustrates a logical unit FIFO controller utilized in accordance with an embodiment of the invention.

As shown with reference to FIG. 11, the Command & Page Parser 1008 looks specifically for Page and Write commands A Page command causes a number of things to happen. First, a buffer is allocated from the write Page Buffer Memory 1102 and the address of that buffer is placed into the page queue 1104 for the addressed LUN. Then the remainder of that page is transferred from the input FIFO (e.g., 1000) into the memory buffer that was allocated. The PAGE command is then removed from the data stream by the Command Parser block 1008.

The command parser block 1008 checks write commands with a state machine, if two pages arrive followed by a write 1-page command, there is an error. In that case a FREE_BUFFER command is inserted into the command queue and the LUN controller frees the buffer rather than leave it allocated and unused. Once a correct write command is detected it is placed into the write queue 1106. All other commands go into the "other" queue 1108. FREE_BUFFER commands go into the write queue 1106.

The LUN controller has to know which commands are destined for the flash and which it can deal with. The LUN controller can deal directly with write_error, ping and free_buffer. All other commands have some flash interaction and will be processed by the channel scheduler. The LUN controller performs buffer allocation from the read buffer memory and the buffer freeing in the write buffer memory.

The channel scheduler parses the opcode for read, write and execute commands. These are the main commands RESET_LUN and RESET_MSC are also understood as they do a reset LUN operation on the flash device. The channel scheduler issues suitable read and write commands to the flash and moves the data between buffers. Completed commands are passed into the done queue 1110 by the LUN controller along with buffer addresses for the read commands The De-Mux 1112 passes the completed commands into the appropriate MMC FIFO. It has to understand the opcode command as well. A read complete has parallel page address information in the LUN FIFO. The De-Mux 1112 generates the PAGE commands of the correct form for transportation of flash pages to the appropriate MMC.

Commands are parsed into two groups and placed onto two queues, a write queue 1106 and a queue for all other commands 1108. All data pages are placed into the Write Page Buffer 1102 and the address of the buffer is passed into the page queue 1104. Having the writes separated from the other commands allows reads to be prioritized above write commands In the return direction, i.e. from the flash Device to the MMC, all commands for which there is a response are placed in the done queue 1112 in order of execution. Any page data, i.e. read pages, have the data placed in the Read Page Buffer 1114 and the address of that buffer is passed in the page queue 1104.

Figure 12:
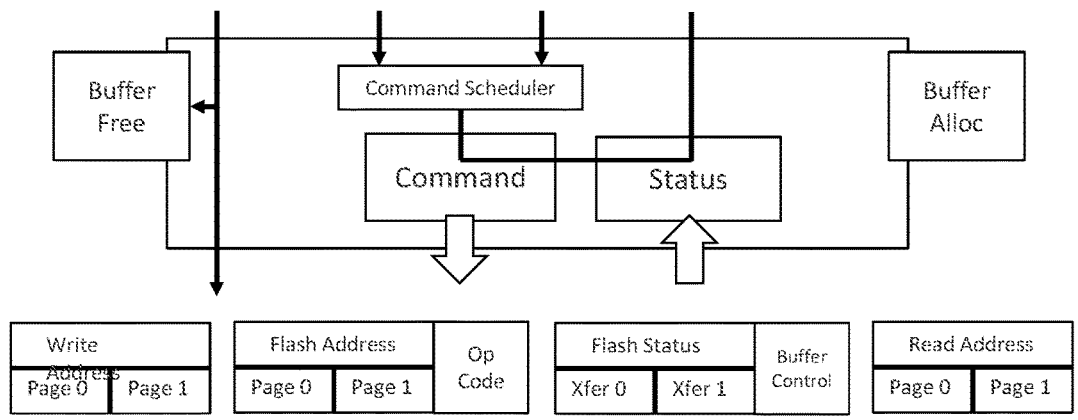
FIG. 12 illustrates a logical unit controller configured in accordance with an embodiment of the invention.

An embodiment of the LUN Controller is shown in FIG. 12. The LUN controller connects directly to the LUN FIFO. The LUN Controller has two major groups of commands: commands that go to the Flash Device and commands that don't go to the Flash Device. For example, PING is an example of a command that does not go to the flash device. A ping command is fully executed in the LUN controller. A PING command comes in through the command scheduler and is sent out directly to the done queue 1112 in the LUN FIFO. WRITE_ERROR and FREE_BUFFER are also fully handled in the LUN controller.

All other commands have some interaction with the flash device.

A RESET_MSC command resets all the buffers in both the read and write buffer memories. It also aborts any commands in progress and issues a RESET_LUN command to the flash device. A RESET_MSC command should only be scheduled when no other commands are in progress.

In general the LUN controller will "present" a command to the Channel scheduling controller. This means that a valid command, which consists of an opcode, 0, 1 or 2 flash addresses and also a read and write buffer address. In the case of a write, the memory location specified in the write addresses is used to write to the flash at the flash address. In the case of a read the flash address is used to read a page and it is written to the buffer specified by the read addresses.

The LUN controller will hold the read, write and flash addresses and the opcode (shown at the bottom of the diagram above) until the channel scheduler has passed the command over the flash channel and has a result. At the end of the command the status from the flash device is passed into the LUN controller and the LUN controller writes the status bits into a return message and terminates the command. Once the command is complete, the channel scheduler indicates how many buffers should be freed (in the write case) or how many buffers should now be allocated (in the read case). After that the command scheduler selects which command queue should be read and the next command is presented to the channel scheduler for execution in the flash device.

Figure 13:
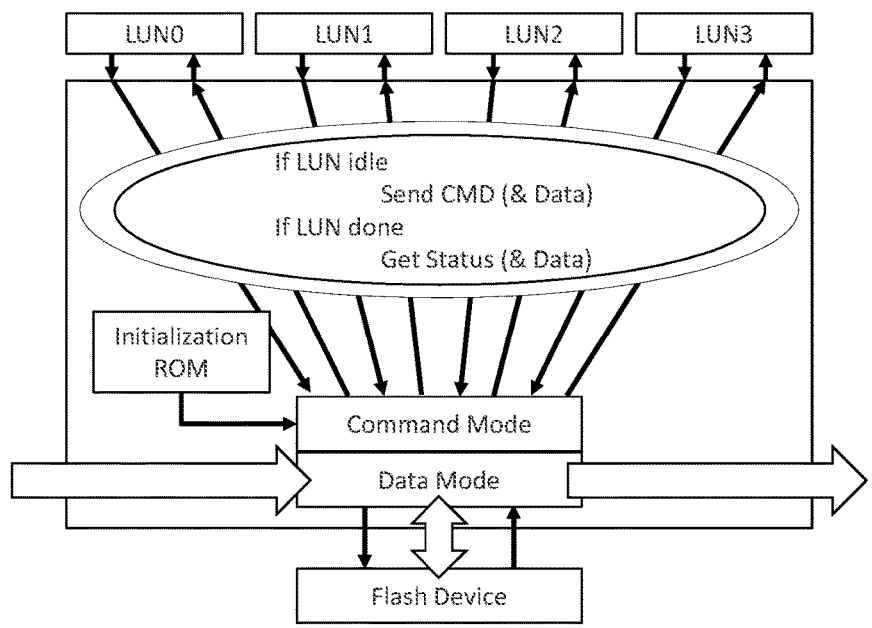
FIG. 13 illustrates a flash memory interface utilized in accordance with an embodiment of the invention.

FIG. 13 illustrates a channel scheduler and control block utilized in accordance with an embodiment of the invention. The channel scheduler is configured for flash device initialization and multiplexing command requests and data transfers from the LUN controllers. In one embodiment, all commands and data are transferred over an 8-bit flash channel to the flash device. The initialization includes an initial RESET_LUN instruction to the flash device and then commands to start the synchronous transfer mode (the flash comes up in asynchronous mode). In case one needs to set driver strengths and other initialization parameters, an initialization ROM is used to direct commands over the interface in command mode. Once all four LUNs are initialized, the main command-polling loop is started. In general a READ_STATUS_ENHANCED command is used to see if a LUN is idle and to see if a prior command has been completed. This command also has the side effect that when addressed to a specific LUN, all other LUNs are unable to drive data to or read data from the 8-bit data bus.

If a LUN in the flash device is idle and a command is available, the command is sent to the LUN. In the case of a write, the data is also transferred to the LUN over the channel. Once a command is in progress, the internal flash BUSY status is polled with the READ_STATUS_ENHANCED command Once a command is complete, the status returned from the command is returned to the LUN controller. In the case of a read command, the data is read from the flash device over the channel and is sent to the read page buffer memory. In the case of an erase, no page data needs to be transferred over the flash channel.

Figure 14:
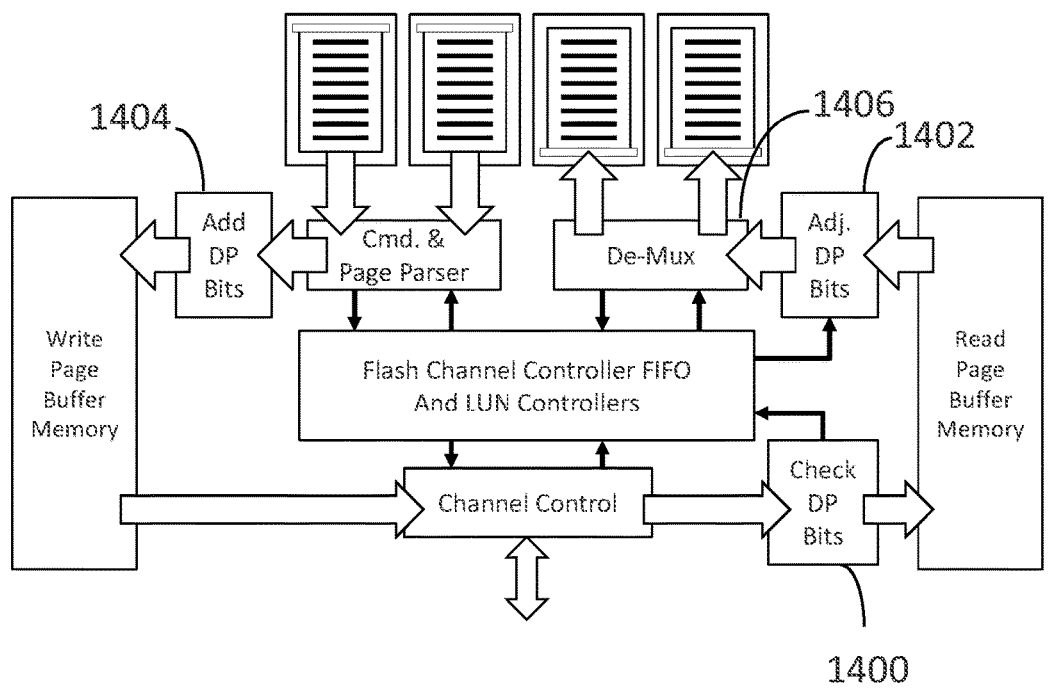
FIG. 14 illustrates a data protection system utilized in accordance with an embodiment of the invention.

Data Protection may be performed in three steps: add protection parity bits to the original data, process the data bits and parity bits to see if there are any errors (a syndrome is generated to indicate which bits are in error) and correct the errors that were found (if any) and recover the original data bits. Often the last two are combined around a FIFO. In general, the data is broken into blocks. One issue is that correction of data requires the data block and the information on which bits to correct and often the block has "gone by" when the "bits to adjust" information is available. These blocks are shown in FIG. 14. In particular, the figure illustrates a block to check bits 1400, a block to adjust bits 1402 and a block to add bits 1404.

The Add DP Bits Block 1404 accepts a 4 kB page as it is written by the Page Parser and inserts an extra 104 B every 512 B of data. As we write pages every 512 B becomes 616 B including parity bytes. When the Add DP Bits block 1404 needs to write to memory, it can pause the flow of the page and cause the input FIFO to back up a little, so the insertion of the parity bits is quite straightforward. The flash pages in the write page buffer are now protected and can be written out to flash.

Some time later when we read the pages from flash, protected pages are read from the flash and pass through the Check DP Bits block. This block passes the bytes directly into the read page buffer but uses the data bytes and the parity bytes to generate a syndrome indicting what the errors are in each block. The syndrome information is passed through a previously unspecified queue in the LUN controller along with the buffer address.

When the flash page data is read from the read page buffer, the correction specified in the syndrome can be applied to the 616-byte blocks and they can be written into the De-Mux block 1406 as 512 B corrected blocks. If the syndrome is significantly larger than expected, a FIFO may be used.

In one embodiment, the inputs to the flash controller include the 4-wire handshake along with 16-bits of data. The 4-wires are start_bit, end_bit, valid and ready flowing in the other direction. The bottom of the flash controller hooks up to an actual flash device and therefore port assignments are specified by the datasheet for the device.

The System Baseboard (SBB) attaches via eight connectors on the bottom side to four Root Interface Boards (RIBs) in the computer chassis. Four Memory Module Baseboard (MMBB) cards plug into connectors on the topside of the SBB. Other than power distribution, the SBB is simply an interconnect mechanism for the purpose of simplifying the connection to the computer chassis.

The Carrier Card serves as the baseboard for sixteen branches. There is one carrier card per root and up to eight per system. This board provides power distribution to the carrier cards through suitable connectors. Redundant hot-pluggable power supplies also dock to this board.

The branch card is designed to be a field replaceable unit (FRU). It consists of a single leaf controller and sixteen solid-state devices. A 6U enclosure may be mounted in a 19" rack above the computer. Power supplies and fans sufficient to cool the unit are included, as is EMI shielding.

Off-the-shelf 12V power supplies able to run on either 220 VAC or 110 VAC power the unit. The 12V supply rails are distributed as appropriate and regulated down to the necessary lower voltages. Local Voltage Regulators (VRs) and Low-Dropout Regulators (LDOs) provide the regulation.

The use of 12V to power the unit will make eventual support for battery backup early write termination (EWT) simpler. An Uninterruptible Power Supply (UPS) operates at the level of the AC input.

Figure 15:
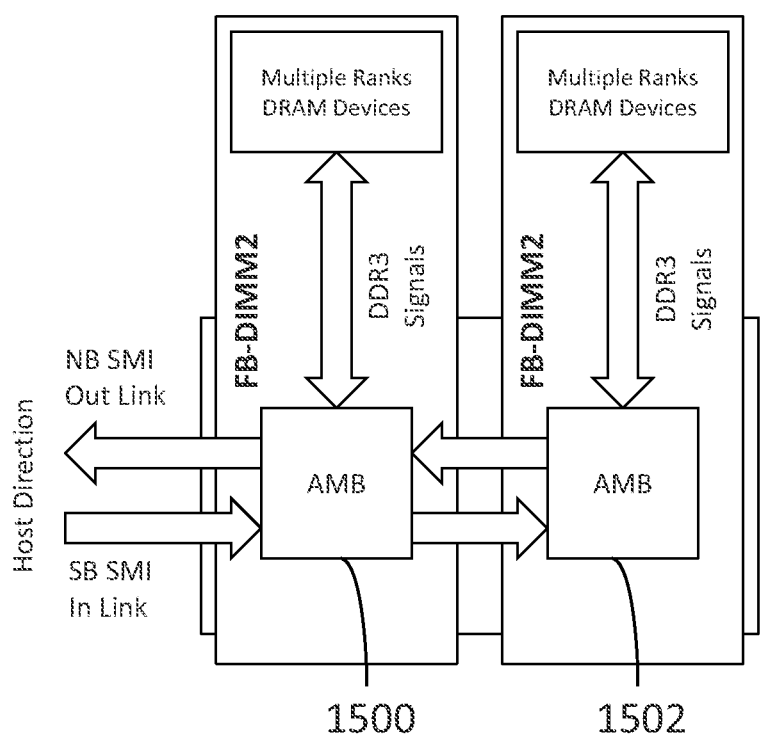
FIG. 15 illustrates a memory buffer utilized in accordance with an embodiment of the invention.

The memory buffer (e.g., an Intel 7510 Scalable Memory Buffer) is conceptually based on the JEDEC Fully Buffered Dual Inline Memory Module (FBDIMM) Advanced Memory Buffer (AMB) as described in JESD82-20A. FIG. 15 shows the logical view of the memory buffer as two independent AMBs 1500, 1502 each operating a pair of DDR3 RDIMMs. Unlike the JEDEC AMB, the Intel 7510 does not support daisy chaining. Thus, one 7510 chip is required for each of the two SMI buses on the SMIB card.

Figure 16:
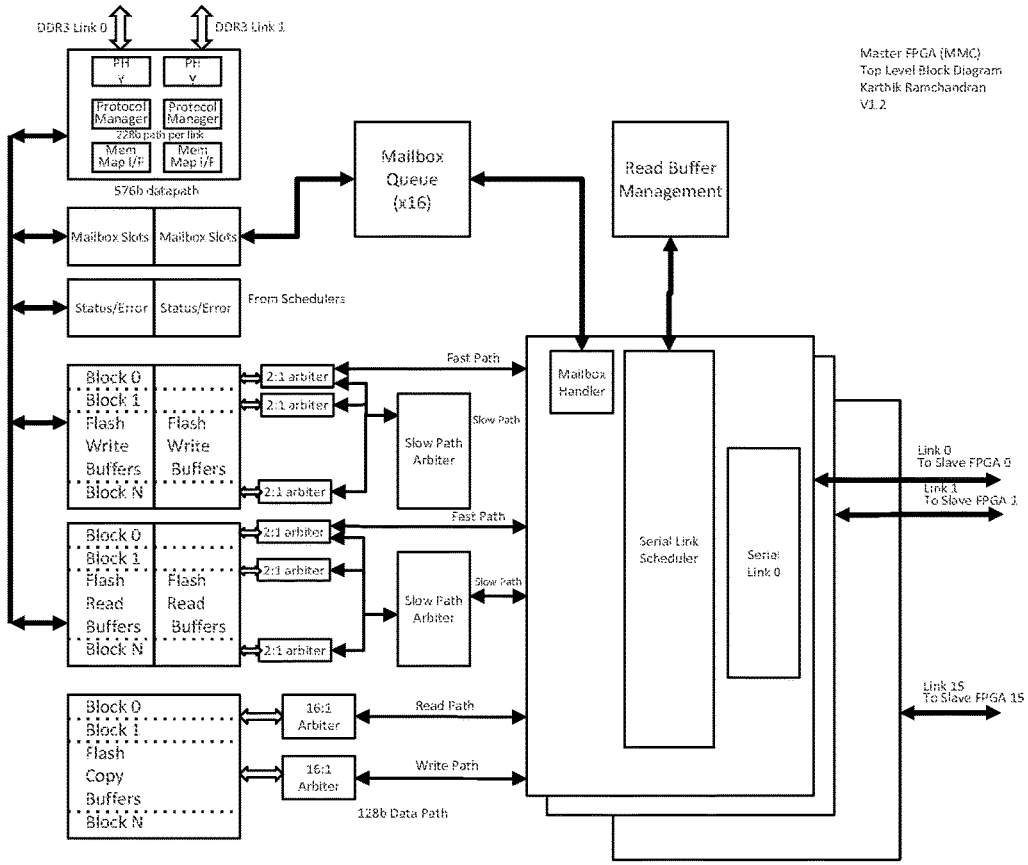
FIG. 16 illustrates a root complex utilized in accordance with an embodiment of the invention.

The root complex, combined with the branches and leaves, creates a distribution network for pages of data that will be written into the pages of the solid-state memory (e.g. flash memory) in the leaves. FIG. 16 is a representation of the root complex showing . . . .

The software created for the working model comprises a Linux block device driver and a memory module simulator. A simulation and unit test framework is available for running the Linux block device driver and the memory module simulator.

The software components typically include a Business Intelligence application, a fraud detection application, a programmed trading application, or other application requiring large datasets and therefore large memory. In addition, the application often requires random access to data and high read/write ratios. These applications are of a type that the owner/user can directly translate time to results into profits. Other applications that require fast, often real time, response such as social networking, massive player on line gaming, and real time data mining have similar requirements for large memory to hold the data being processed.

Ideally, applications require little or no modification to run in the system. Nevertheless, application advantage can always be obtained by tuning/altering the application to take advantage of the hardware and software components of the system.

In one or more embodiments, the database is a relational or object database with datasets approaching 100 TB or more. These datasets cannot be cost effectively processed using DRAM based memory systems and they cannot be processed in a reasonable time using disk-based systems. Databases designed for execution in multicore/multiprocessor environments maintain algorithms and interfaces that support these environments. The invention may take significant advantage of these interfaces. Some databases may be modified in order to provide parallel execution that distributes data accesses across many memory blocks.

Flash storage hardware necessitates decoupling the logical data addresses requested by the operating system from the physical addresses of the flash storage hardware. At a minimum, the data address space presented to the operating system is decoupled from the physical address space of the flash device. This remapping must be performed at the granularity of a single storage data page, which for this system is a 4096 byte page. It is also useful to be able to remap flash at the physical level, in order to handle bad block replacement and perform block reordering for wear leveling. Such remapping can be handled in hardware, but it is also possible to perform this remapping in software by performing an additional level of address translation on flash blocks. Such block reordering is performed at the erase block level.

We refer to the address space seen by the operating system as the Data Address Space (DAS). An address in this space is called a Data Address (DA). The page number portion of a Data Address is a Data Page Number (DPN).

We refer to the virtual address space of the flash storage as the Flash Virtual Address Space (FVAS). An address in this space is called a Flash Virtual Address (FVA). The page number portion of a Flash Virtual Address is a Flash Virtual Page Number (FVPN).

Figure 17:
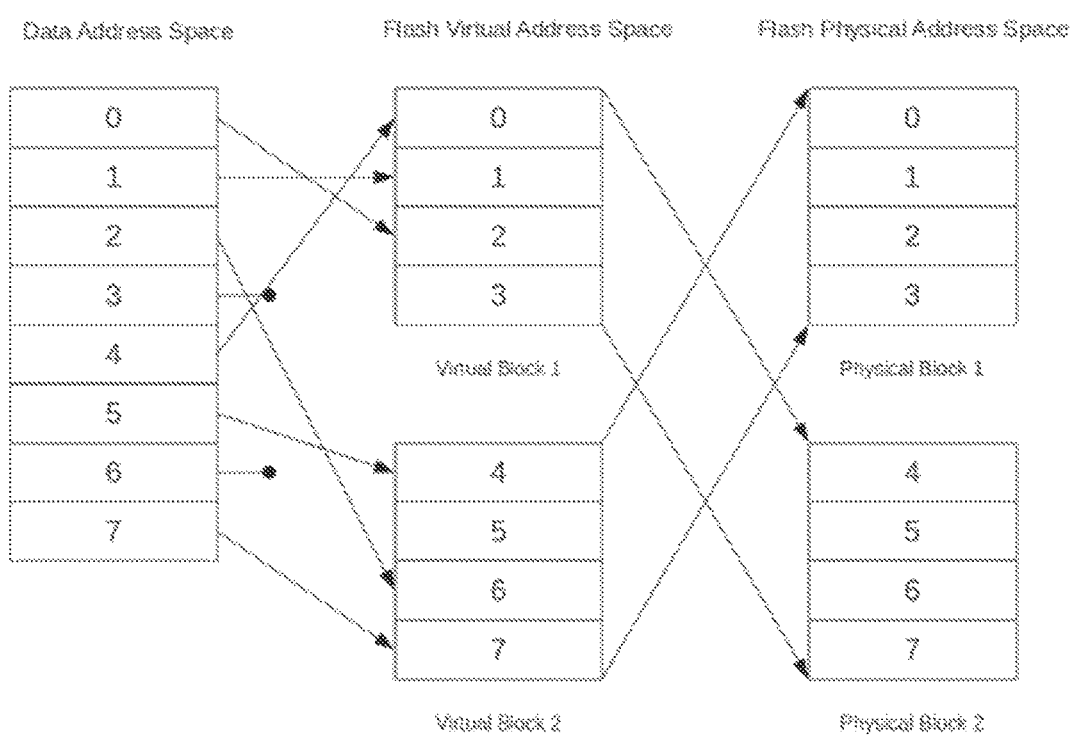
FIG. 17 illustrates an address mapping scheme utilized in accordance with an embodiment of the invention.

Finally, we refer to the physical address space of the flash storage as the Flash Physical Address Space (FPAS). An address in this space is called a Flash Physical Address (FPA). The page number portion of a Flash Address is a Flash Physical Page Number (FPPN). Note that in x86 there are already well-known terms Virtual Address (VA), Virtual Page Number (VPN), Linear Address (LA), Linear Page Number (LPN), Physical Address (PA), and Physical Page Number (PPN). We don't want to use the terms logical address or physical address in order to avoid confusion with the x86 terms with the same acronym. Thus we explicitly disambiguate by referring to Flash Virtual or Flash Physical addresses, instead of just Virtual or Physical Addresses. Mappings between the Data Address Space, Flash Virtual Address Space, and Flash Physical Address are shown in FIG. 17.

The firmware responsible for providing the data in parallel operates on data blocks that may vary in size. Smaller blocks are provided more quickly than larger blocks. The firmware may be implemented in ASICs or other hardware.

An embodiment of the present invention relates to a computer storage product with a non-transitory computer readable storage medium having computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to:

magnetic media, optical media, magneto-optical media and hardware devices that are specially configured to store and execute program code, such as application-specific integrated circuits ("ASICs"), programmable logic devices ("PLDs") and ROM and RAM devices. Examples of computer code include machine code, such as produced by a compiler, and files containing higher-level code that are executed by a computer using an interpreter. For example, an embodiment of the invention may be implemented using JAVA®, C++, or other object-oriented programming language and development tools. Another embodiment of the invention may be implemented in hardwired circuitry in place of, or in combination with, machine-executable software instructions.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. A data processing system, comprising:
a plurality of processors, each having one or more processor cores, wherein each of the processors is coupled to each of remaining processors via a cluster of processor interconnects, the cluster of processor interconnects forming a data distribution network; and
a plurality of roots coupled to the processors, each root corresponding to one of the processors, wherein each root comprises
a memory controller,
one or more branches coupled to the memory controller, and
a plurality of memory leaves coupled to the branches, each memory leaf having one or more solid state memory devices, wherein each of the branches is associated with one or more of the memory leaves and provides access to the associated memory leaves,
wherein each of the processors can access any one of the memory leaves via a corresponding branch of any one of the roots over the data distribution network, and wherein each of the roots utilizes branch connections to individual memory leaves to distribute a chain of read/write requests so that each individual read/write request is directed to a different memory leaf.

2. The system of claim 1, further comprising a collection of dynamic random access memory (DRAM) devices coupled to memory controllers of the roots, wherein each memory controller of each root is associated with one or more of the DRAM devices over a memory bus.

3. The system of claim 2, wherein each of the processors can access any one of the DRAM devices associated with the remaining processors over the cluster of processor interconnects.

4. The system of claim 1, wherein each memory controller comprises:
one or more memory interfaces coupled to the data distribution network to allow any of the processors to access the memory leaves associated with the corresponding root; and
one or more branch interfaces coupled to one or more branches to allow the memory interfaces to access the memory leaves associated with the corresponding root.

5. The system of claim 4, wherein each of the memory interfaces is coupled to each of the branch interfaces.

6. The system of claim 4, wherein each branch interface comprises an internal memory hosting a first software stack executed therein, and wherein the first software stack comprises a routing software and non-blocking parallel solid state interface (NBSI) driver.

7. The system of claim 6, wherein the routing software is configured to route memory access requests from any of the processors to any of the memory leaves associated with the branch interface.

8. The system of claim 6, wherein the NBSI driver is configured to provide parallel accesses to the associated memory leaves from multiple processors without blocking each other.

9. The system of claim 6, wherein each branch interface comprises computational resources to coordinate data searched in individual memory leaves and data processing of retrieved data from the individual memory leaves.

10. The system of claim 1, wherein each branch comprises a leaf interface controller having a second software stack executed therein for accessing the memory leaves associated with the branch.

11. The system of claim 10, wherein the leaf interface controller is configured with computational resources to search for data within individual memory leaves and data processing of retrieved data from the individual memory leaves.

12. The system of claim 10, wherein the second software stack comprises a network driver and a solid state driver executed therein.

13. The system of claim 10, wherein the second software stack further comprises at least one of a database engine, a data compression engine, or a data encryption engine executed therein.

14. The system of claim 10, wherein each leaf interface controller is configured with computational resources to search for data within the associated memory leaves and data processing of retrieved data from the associated memory leaves.

15. The system of claim 1, wherein each processor independently accesses the memory leaves without interfering with an access by another processor.

16. The system of claim 1, wherein each of the processors accesses memory resources through a hierarchy of roots and branches configured for chained data reads or writes (reads/writes) that exploit parallelism associated with the memory resources.

17. The system of claim 1, wherein the branches distribute a chain of read/write requests so that each read/write request is directed to a different memory leaf.

18. The system of claim 1, wherein the processors are configured for directly accessing memory resources by determining that a primary host of a data segment is unavailable and retrieving the data segment from a redundant host.

19. The system of claim 18, wherein the data segment is reconstructed by one of the processors from data protection codes retrieved from the redundant host.

20. The system of claim 18, wherein the data segment is reconstructed by a root from data protection codes retrieved from the redundant host.

21. The system of claim 18, wherein the data segment is reconstructed by a branch from data protection codes retrieved from the redundant host.

* * * * *